United States Patent [19]

LaGreco et al.

[11] Patent Number: 4,596,907

[45] Date of Patent: Jun. 24, 1986

[54] COMBINATION SWITCH/LATCH FOR CONTROLLING CIRCUIT MODULE/ENERGIZATION WHILE SECURING MODULE TO SUPPORT HOUSING

[75] Inventors: Angelo S. LaGreco, Hopatcong; Richard T. LaGrotta, Stanhope, both of N.J.

[73] Assignee: AT&T Bell Laboratories, Murray Hill, N.J.

[21] Appl. No.: 605,238

[22] Filed: Apr. 30, 1984

[51] Int. Cl.⁴ .............................................. H01H 9/20
[52] U.S. Cl. .................................. 200/50 R; 200/292
[58] Field of Search .................. 200/50 A, 50 R, 292; 361/413, 415, 58; 339/45 M, 75 MP; 211/41

[56] References Cited

U.S. PATENT DOCUMENTS

| | | | |
|---|---|---|---|
| 3,562,464 | 2/1971 | Vollum et al. | 200/153 |
| 4,002,381 | 1/1977 | Wagner et al. | 211/41 |
| 4,071,722 | 1/1978 | Hart | 200/50 A |
| 4,313,150 | 1/1982 | Chu | 361/399 |
| 4,454,396 | 1/1984 | Neese | 200/292 |

Primary Examiner—A. D. Pellinen
Assistant Examiner—Morris Ginsburg
Attorney, Agent, or Firm—Alfred G. Steinmetz

[57] ABSTRACT

A combination latch/switch mechanism is operative to lock a circuit board into a support housing and enable and disable selected circuits during the insertion process. A lever of the mechanism includes a notch to engage the support housing and a contact arrangement engaging and disengaging circuit paths as the circuit board is inserted into the housing.

14 Claims, 10 Drawing Figures

COMBINATION SWITCH/LATCH FOR CONTROLLING CIRCUIT MODULE/ENERGIZATION WHILE SECURING MODULE TO SUPPORT HOUSING

TECHNICAL FIELD

This invention relates to a combination latch and switch mechanism and, in particular, to a mechanism which makes and breaks circuits while securing a circuit package or module into a support housing and connecting it into contactor apparatus in a backplane.

BACKGROUND OF THE INVENTION

A common circuit module mounted arrangement for combining a latch and switch (i.e., latch/switch) operation involves a mechanical interaction between a toggle switch on a circuit module and a latch also mounted on the module. As the latch is actuated to lock the circuit module into a support housing, it engages the toggle switch and moves it to successive positions engaging first one then another selected electrical circuit on the module as it is locked into place in the support housing. When the circuit module is removed from the housing, the opening of the latch moves the engaged toggle switch to de-energize the circuit module as it is removed so that no electrical hazard condition occurs as the circuit module is disengaged from the backplane.

A problem with the above arrangement is the required preciseness of the mechanical interconnection between the latch and toggle switch. The difficulty of matching latch positions with toggle switch positions, especially with a three position toggle switch, necessitates strict dimensional tolerances during manufacture adding considerably to the overall cost of the latch/switch mechanism. This latch/switch arrangement is furthermore readily susceptible to mechanical failure in actual field operation, while damage may cause the latch/switch arrangement to partially fail and accordingly fail to de-energize a circuit as expected thereby causing a dangerous electrical hazard. It may, on the other hand, allow electrical power to be applied prematurely to the circuit module resulting in damage to electrical components contained thereon.

It is apparent from the foregoing that a suitable latch/switch arrangement must be readily manufacturable without undue narrow tolerance requirements if it is to be economically viable. It must also be mechanically reliable in providing the necessary sequential circuit connections during insertion and removal operations to minimize electrical hazards and protect circuit components.

Recent manufacturing techniques for printed circuit boards, which may comprise the circuit module, require immersion of the board into a soldering flux during certain stages of manufacturing. This means that a toggle switch may not be installed until all soldering processes have been completed, even though the immersion is for the purpose of completing all electrical connections which include the toggle switch.

SUMMARY OF THE INVENTION

A combination latch/switch mechanism is operative for securing a circuit module into a support frame and enabling a circuit connection on the module controlling the application of energy in discrete steps to the circuit of the module during the insertion process. The mechanism comprises a lever pivotally attached to the circuit module. An extension of the lever engages the frame and, by pivoting the lever around the pivotal mounting, the lever forces the engagement of electrical connection means in the backplane joining the module and frame. The module has a plurality of printed circuit conduction paths and the lever has cam-like electrical contacts positioned to engage the various conduction paths as the lever is rotated around the pivot means. Hence, as the module is secured into the frame by pivoting the lever, the contacts engage the printed circuit conduction paths to make and break circuit paths to enable energization of the circuit and to engage start-up circuit features such as inrush current control.

An advantage of the invention is that emersion techniques may be used to solder the conduction paths hence eliminating the separate operation needed to connect a toggle switch.

Another advantage is the minimal tolerance requirement of this arrangement thereby reducing manufacturing costs.

A further advantage is that no mechanical bias mechanisms common to toggle arrangements are required thereby improving lifetime reliability of the latch/switch.

BRIEF DESCRIPTION OF THE DRAWING

The principles of the invention will be better understood upon consideration of the following detailed description and appended claims taken in conjunction with the attached drawings of an illustrative embodiment in which:

DETAILED DESCRIPTION

Figure 1:
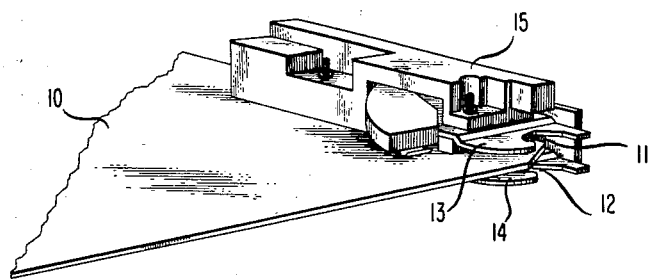
FIG. 1 is a fragmentary perspective view of the latch/switch arrangement mounted on a circuit board or module.

A latch/switch arrangement embodying the principles of the inventors is shown in a perspective view in FIG. 1. A latch assembly is mounted on a corner of a printed circuit board module 10 and positioned so that slots 11 and 12 on the bottom positions of top and bottom plates 13 and 14 of the switch/latch assembly may engage the edge of a lip of the housing structure into which the circuit board is to be inserted.

Figure 2:
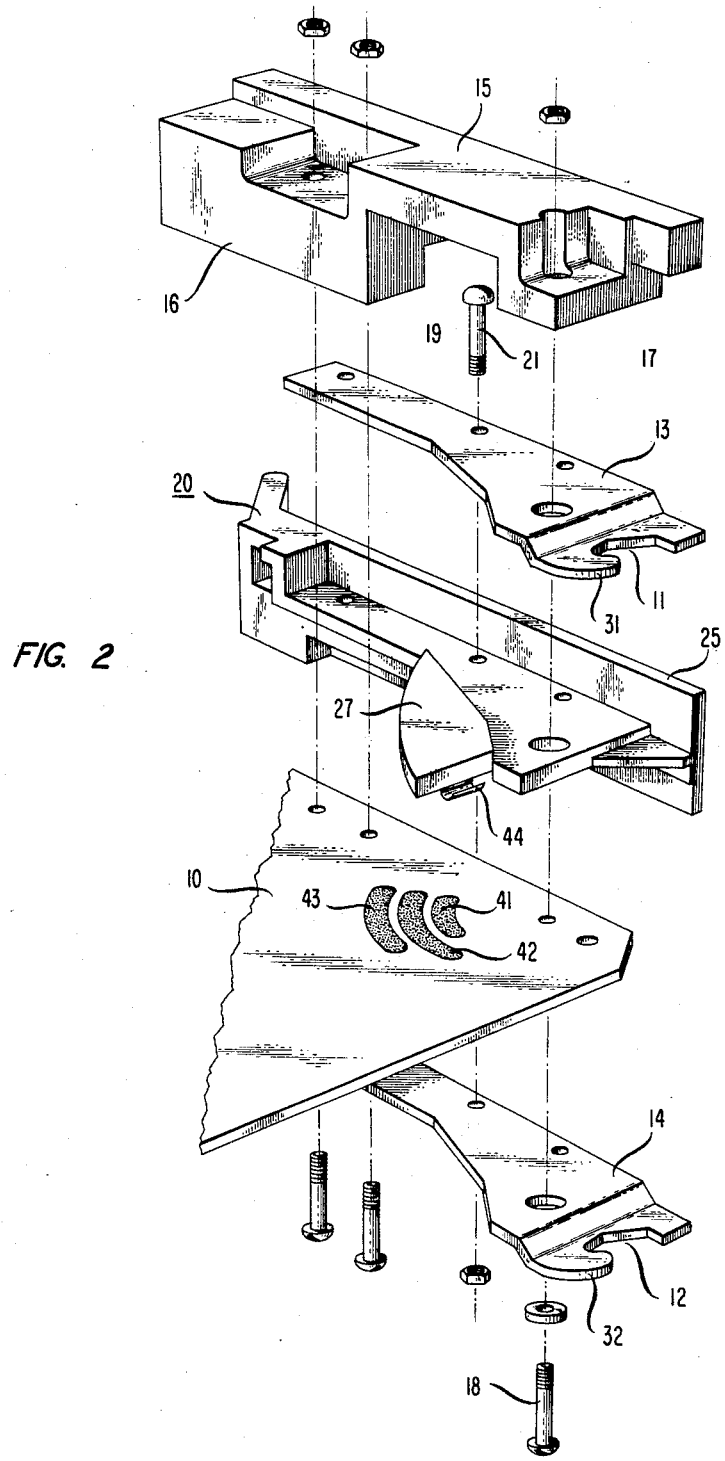
FIG. 2 is an exploded view of the switch latch assembly mounted on the circuit module.

The details of the latch/switch assembly may be more readily appreciated by reference to the exploded perspective view of the assembly shown in FIG. 2. The support member 15, which may be of a plastic material, is designed to be in connection with the circuit board 10 and provide a support structure for the latch assembly. A pad 16 under and at one end of the structure 15 is designed to rest directly on a surface of the circuit board 10 and is attached with the screws and securing nuts. A second pad 17, also on the underside, is less in height dimension than the first pad and fits over a pivot pin or screw 18 of the lever assembly around which the lever pivots or rotates. The back underside region 19 of the structure 15 adjacent the pad 16 is relieved to permit space for the lever support member 20 and a top surface plate 13 to go under the structure 15 when the lever is in a closed position.

The top side plate is affixed to the top surface 21 of the lever 13 by screws such as screw 18 or suitable equivalent. The lever 13 is dimensioned so that the cut away portion defined by edges 23 and 24 fits into the support structure recess 19. A back flange or web portion 25 of the lever 20 rests outside the recessed area 19 and is also out of the edge 26 of the printed circuit board 10. The bottom and top side plates 13 and 14 include the notches 11 and 12 positioned to engage an edge lip 59 (shown in FIG. 10) of the structure housing into which the circuit board is to be inserted. The shape of each of the notches includes prong 31 and prong 32 each of which is hook shaped so as to engage a edge lip 59 (shown in FIG. 10) of the housing while the lever is in an open position and while the circuit board is only partially inserted with the connector to the backplane as yet unengaged.

The lever includes a semicircular pad 27 which overrides a plurality of arc circuit paths 41, 42, and 43 printed on the printed circuit board or module 10. Two contacts (of which one 44 is visible) on the underside of the semicircular pad act to electrically connect two of the three arc circuit paths with each other. These three circuit paths 41, 42 and 43 are interconnected with and, when any two are connected electrically, they complete various circuits (not shown here) physically located on the other side of the printed circuit board. These various circuits may include an inrush current limit circuit operative to limit current during the insertion and connection operations. As is apparent, the different arc lengths of the arc circuit paths 41, 42 and 43 permit differing ones of the arcs to be interconnected as the contact pads of the lever are rotated over them thus permitting the enabling and disabling of differing circuits. As the lever is. rotated during insertion of the circuit board 10 into a support housing, the contacts or pads on the lever slide across the arc circuit paths 41, 42 and 43 of differing length and hence successively enable and disable various circuit connections of circuits on the circuit board 10 which enable and disable circuits on the printed circuit board.

Figure 10:
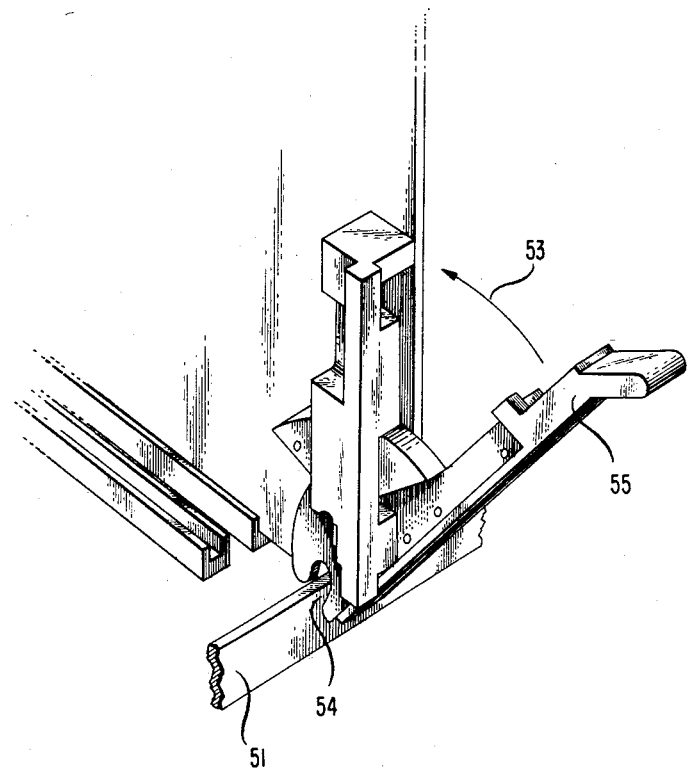
FIG. 10 is a perspective view of a circuit module partially inserted into a support housing.

The operation of the latch/switch in securing a circuit module 10 into a housing structure 50 may be seen in the fragmentary perspective view shown in FIG. 10. The notch 54 of the lever 20 fit over an edge lip 51 of the housing structure 50 which acts as a fullcrum. Hence, as the lever is rotated, a force 53 is generated and is applied through the pivot pin of the lever to drive the circuit module into the housing and provide the necessary force to accomplish the electrical connection in the backplane.

Figure 3:
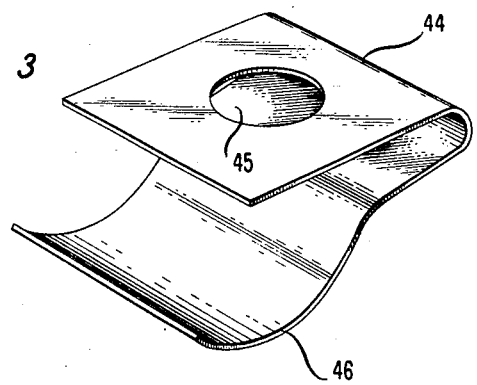
FIG. 3 is a perspective view of a piece part of the latch/switch assembly.

The contact clip 44 is shown in detail in FIG. 3 and comprises a clip of conductive spring material. The top portion has a hole 45 to permit its fastening to the underside of the semicircular pad 27 of the lever 20 while the bottom part has a semicircular shape to permit the bottom 46 of the clip to ride tangentially on the semicircular arc circuit paths of the circuit board.

Figure 4:
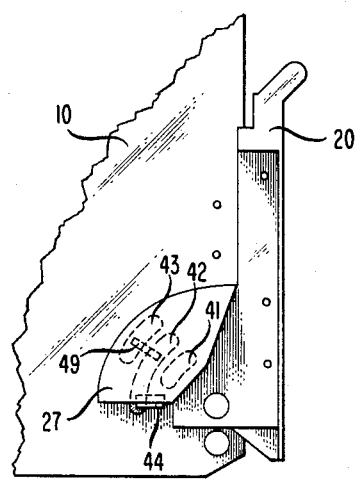
FIG. 4 is a side view of a portion of the latch/switch assembly.

A side view of the mounted lever 20 in a closed position is shown in FIG. 4 without the side plate 13 of FIG. 2 attached to the lever. In this position the bottom semicircular portion of a front contact pad 49 is shown electrically connecting the outer two arc circuit paths 42 and 43 while the semicircular portion of the second contactor pad 44 is shown connected only to center arc 42 and hence is not enabling a circuit connection. The top portion of the contact device is not shown in FIGS. 4, 5, and 6, only the semicircular portion, identified as semicircular portion 146 in FIG. 7, is shown to simplify the drawing.

Figure 5:
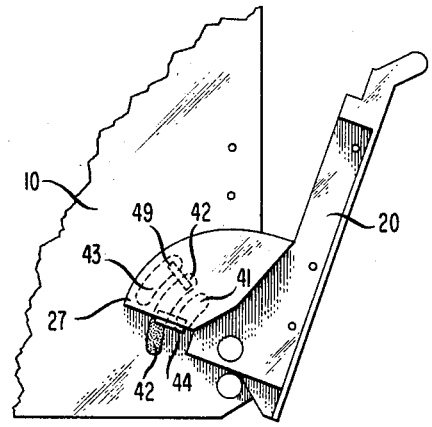
FIG. 5 is another side view of a portion of the latch/switch assembly.

In FIG. 5 the lever is shown rotated approximately 30° from the vertical such as it would be when the electrical connections to the back plane are partially engaged but not fully seated therein. Here the semicircular portion of the first contact 49 still engages the outer two arc circuit paths 42 and 43 while the semicircular portion of the second contactor 44 now electrically connects the two inner arc circuit paths 41 and 42.

It is readily apparent from the foregoing that as the lever is rotated as when inserting and locking a circuit board into a housing structure, electrical connections are sequentially enabled and disabled, This permits certain circuits on the circuit board to be connected and disconnected during the insertion operation. For example, during insertion an inrush current limit circuit may be engaged just as the connectors in the back plane make contact and then may be disengaged when the circuit board is fully seated in the housing structure and locked in place.

Figure 6:
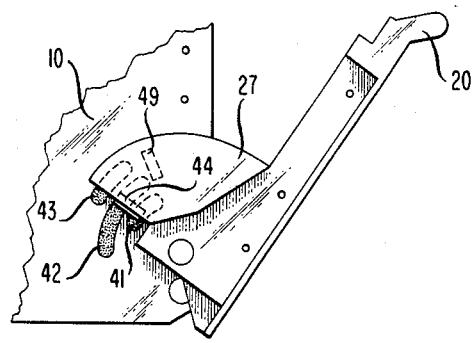
FIG. 6 is yet another side view of a portion of the latch switch assembly.
Figure 7:
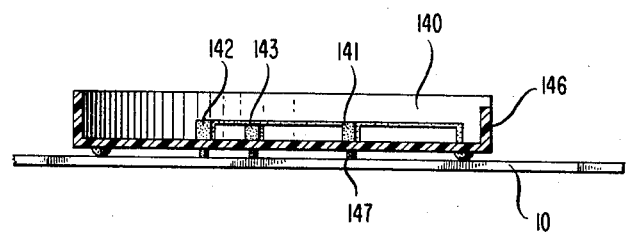
FIG. 7 is a profile view of an arrangement in which modular current paths are attached to a circuit module.
Figure 8:
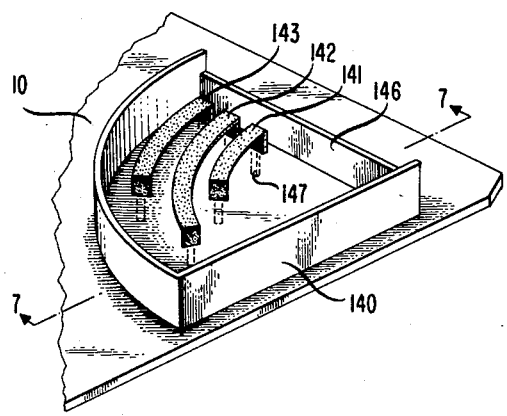
FIG. 8 is a perspective view of the modular current path arrangement of FIG. 7.
Figure 9:
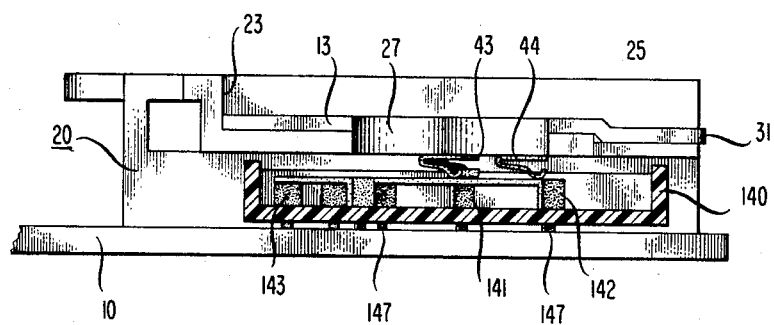
FIG. 9 is a profile view of a latch/switch assembly utilizing the modular current path arrangement of FIG. 7.

The lever 20 is shown in its fully open position in FIG. 6. It is apparent that the bottom semicircular portion of contact pad 49 is fully disengaged from the arc circuit path and that the bottom semicircular portion of contact pad 44 connects the two inner arcs 41 and 42 which are electrically coupled to complete a circuit on the circuit module. The arc circuit paths 41, 42 and 43 may be printed on the circuit board as described above or they may be constructed in a modular form 140 as shown in FIGS. 7, 8 and 9. The modular arc paths are shown in cross sections in FIG. 7. Each arc path as shown in FIG. 8 comprises a conductive arc 141, 142 and 143 with prongs 147 at each end of the arcs which fasten to the modular housing and then through to the circuit board 10. Each point of the prongs pass through the module 140 and connect into receptacles included in the circuit board on which they are mounted. The arc path housing or module 140 as shown in FIG. 8 may be constructed of a plastic like material. It has a low side 146 to permit the pads of the lever containing the contacts to readily pass over it.

A side cutaway view of the path module 140 in combination with the lever 20 is shown in FIG. 9. The pivot point or axis of the lever is below the bottom side of the arc path housing 140 and the semicircular pad 27 of the lever 20 is positioned above the modular arc circuit paths 141–143 and passes over the low side of the module allowing the contact pads to engage the conductive arc circuit paths 141–143.

What is claimed is:

1. A circuit module including a combination latch and switch arrangement operative for securing the circuit module into an apparatus housing and enabling and disabling an electrical circuit connection during insertion and locking of the circuit module into the apparatus housing; the combination comprising:

a lever including a means for locking the circuit module into the apparatus housing, a pivotal mounting for securing the lever to the circuit module and permitting the lever to rotate around the pivotal mounting, a contact arrangement mounted on the lever and operative for first enabling and then disabling the electrical circuit connection as the lever is rotated, the contact arrangement comprising first, second and third conducting paths attached to the circuit module, and first and second conducting contacts attached to the lever and positioned so that the first contact may engage the first and second conducting paths and the second contact may engage the second and third conducting paths, relative positioning and lengths of the first, second and third conducting paths selected so that as the lever is rotated the first conducting contact connects the first and second conducting paths and subsequently the second conducting contact connects the second and third conducting paths, whereby the circuit module is inserted in the apparatus housing with the lever in an open position and the means for locking engaging a structural portion of the apparatus housing and the lever than being rotated to a closed position to lock the circuit module into the apparatus housing.

2. A circuit module including a combination latch and switch arrangement as defined in claim 1 wherein the first and second conducting contacts comprise:

first and second conducting contact clips, the lever including a pad upon which the first and second conducting contact clips are mounted, the first, second and third conducting paths having a circular arc shape and positioned under the pad so as to engage the first and second conducting contact clips, whereby the first and second contact clips interconnect differing ones of the first, second and third conducting paths as the lever is rotated.

3. A circuit module including a combination latch and switch arrangement as defined in claim 2 wherein the first, second and third conducting paths are printed on the circuit module.

4. A circuit module including a combination latch and switch arrangement as defined in claim 2 wherein the first, second and third conducting paths comprise:

a conducting module, first, second and third conducting strips mounted on the conducting module positioned to engage and electrically connect the first and second contact clips.

5. A circuit module including a combination latch and switch arrangement as defined in claim 1 wherein the means for locking includes a notch in the lever adapted for engaging a structural portion of the apparatus housing.

6. A circuit module including a latch/switch arrangement for locking the circuit module into a support housing and engaging a series of circuit paths during insertion of the conduit module into the support housing, the latch/switch arrangement comprising;

a lever including means for engaging a structural part of the support housing, a pivotal mounting securing the lever to the circuit module and permitting the lever to rotate around an axis of the pivotal mounting, first, second and third conducting paths, being located at first, second and third distance from the axis of the pivotal mounting, first and second electrical contacts mounted on the lever with the first contact positioned so it may interconnect only the first and second conducting paths and the second contact positioned so it may interconnect only the second and third conducting paths, the first, second and third conducting paths having different path lengths and relative positioning of the first, second and third conducting paths and the first and second contacts being such that the first and second conducting paths are interconnected by the first and second electrical contacts at a different angular position of the lever than are the second and third conducting paths, whereby various circuits on the circuit module may be enabled and disabled as the lever is rotated.

7. A circuit module including a latch/switch arrangement as defined in claim 6 wherein:

the first, second and third conducting paths have arclike shapes with a common center and are located substantially adjacent to one another, at least the first and second conducting paths having different lengths, and the first and second electrical contacts electrically connecting differing ones of the conducting paths as the lever is rotated.

8. A circuit module including a latch/switch arrangement as defined in claim 7 wherein:

the means for engaging comprises a notch on the lever positioned to engage a structural part of the support housing with the lever in an open position, the structural part serving as a fulcrum to apply force to insert the circuit module into the support housing as the lever is rotated to a closed position.

9. A circuit module including a latch/switching arrangement as defined in claim 8 wherein:

the first, second and third conducting paths are printed on a surface of the circuit module within an area swept by the lever as it rotates.

10. A circuit module including a latch/switch arrangement as defined in claim 8 wherein:

the first, second and third conducting paths comprise;

a conducting module mounted on the circuit module proximate to an area swept by the lever as it is rotated, and first, second and third conducting strips mounted on the conducting module positioned to engage the electrical contacts on the lever and electrically connected to circuits contained on the circuit module.

11. A circuit module including a combination latch/switch arrangement operative for securing the circuit module into a support housing comprising:

a lever including engaging apparatus for interlocking with a portion of the support housing, a pivotal mounting for securing the lever to the circuit module and permitting the lever to rotate around the pivotal mounting, an electrical contact arrangement including at least first and second contacts mounted on the lever adjacent a surface of the circuit module, a series of conducting paths on the circuit module including at least first, second and third conducting paths having an arc shape centered about the pivotal mounting and being at a first, second and third radius respectively, the first contact being radially positioned at a fourth radius to engage the first and second conducting paths, the second contact being radially positioned at a fifth radius to engage the second and third conducting paths, the first, second and third conducting paths each having differing arc lengths and positioned so that the first contact may connect the first and second conducting paths during a first rotational interval of the lever and the second contact may connect the second and third conducting paths during a second rotational interval of the lever, the first and second rotational interval being substantially exclusive of each other.

12. A circuit module as defined in claim 11 wherein:
the engaging apparatus comprises a notch on the lever positioned to engage a member of the support housing with the lever in an open position, the member of the support housing serving as a fulcrum to apply force to insert the circuit module into the support housing as the lever is rotated to a closed position.

13. A circuit module as defined in claim 12 wherein:
the first, second and third conducting paths are printed on a surface of the circuit module within an area swept by the lever as it rotates.

14. A circuit module as defined in claim 12 wherein:
the first, second and third conducting paths comprise:
an electrical conduction module mounted on the circuit module proximate to an area swept by the lever as it rotates and positioned to engage the first and second contacts on the lever and electrically connected to circuits contained on the circuit module.

* * * * *